(12) United States Patent
Van Der Wijst et al.

(10) Patent No.: US 8,203,694 B2
(45) Date of Patent: Jun. 19, 2012

(54) LITHOGRAPHIC APPARATUS, PROJECTION ASSEMBLY AND ACTIVE DAMPING

(75) Inventors: Marc Wilhelmus Maria Van Der Wijst, Veldhoven (NL); Erik Roelof Loopstra, Eindhoven (NL); Cornelius Adrianus Lambertus De Hoon, Best (NL)

(73) Assignee: ASML Netherlands B.V., Veldhoven (NL)

( * ) Notice: Subject to any disclaimer, the term of this patent is extended or adjusted under 35 U.S.C. 154(b) by 861 days.

(21) Appl. No.: 12/244,879

(22) Filed: Oct. 3, 2008

(65) Prior Publication Data

US 2009/0091725 A1  Apr. 9, 2009

Related U.S. Application Data

(60) Provisional application No. 60/960,579, filed on Oct. 4, 2007.

(51) Int. Cl.
*G03B 27/42* (2006.01)
(52) U.S. Cl. .......................................................... 355/53
(58) Field of Classification Search ................. 355/53, 355/72–76; 250/548; 356/399–401
See application file for complete search history.

(56) References Cited

U.S. PATENT DOCUMENTS

| | | | |
|---|---|---|---|
| 6,472,840 B1 | 10/2002 | Takahashi | |
| 7,110,083 B2 * | 9/2006 | Loopstra et al. | 355/53 |
| 7,170,580 B2 * | 1/2007 | Leenders et al. | 355/53 |
| 7,726,452 B2 * | 6/2010 | Kraner | 188/378 |
| 2003/0169412 A1 * | 9/2003 | Hazelton | 355/72 |
| 2006/0272910 A1 | 12/2006 | Kraner | |
| 2007/0097340 A1 * | 5/2007 | Yuan et al. | 355/53 |
| 2008/0074629 A1 * | 3/2008 | Groeneveld et al. | 355/53 |

FOREIGN PATENT DOCUMENTS

| | | |
|---|---|---|
| EP | 1 225 482 A1 | 7/2002 |
| JP | 2005-311165 A | 11/2005 |
| JP | 2006-250291 A | 9/2006 |
| WO | WO 2005/073592 A1 | 8/2005 |

OTHER PUBLICATIONS

Singapore Search Report and Written Opinion for Application No. 200807527-7 mailed Jan. 29, 2010, 16 pgs.

* cited by examiner

*Primary Examiner* — Hung Henry Nguyen
(74) *Attorney, Agent, or Firm* — Sterne, Kessler, Goldstein & Fox P.L.L.C.

(57) ABSTRACT

A lithographic apparatus includes an illumination system configured to condition a radiation beam and a support constructed to support a patterning device. The lithographic apparatus further includes a substrate table constructed to hold a substrate; and a projection system configured to project the patterned beam onto a target portion of the substrate. An active damping system is provided to dampen a vibration of at least part of the projection system. The active damping system includes a combination of a sensor to measure a position quantity of the projection system and an actuator to exert a force on the projection system in dependency of a signal provided by the sensor. The active damping system is connected to a damping mass, the damping mass being connected to the projection system.

24 Claims, 2 Drawing Sheets

LITHOGRAPHIC APPARATUS, PROJECTION ASSEMBLY AND ACTIVE DAMPING

CROSS-REFERENCE TO RELATED APPLICATION

This application claims the benefit of the filing date of U.S. Provisional Application 60/960,579 filed on Oct. 4, 2007. The subject matter of that application is incorporated herein by reference as if fully set forth herein.

BACKGROUND OF THE INVENTION

1. Field of the Invention

The present invention relates to a lithographic apparatus, a projection assembly and a combination of a structure and an active damping assembly.

2. Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The high accuracy and high resolution currently aimed at in lithography require an accurate positioning of parts of the lithographic apparatus such as the reticle stage to hold the mask, the projection system and the substrate table to hold the substrate, with respect to each other. Apart from the positioning of e.g. the reticle stage and the substrate table, this also poses requirements on the projection system. The projection system in current implementations may consist of a carrying structure, such as a lens mount (in case of transmissive optics) or a mirror frame (in case of reflective optics) and a plurality of optical elements such as lens elements, mirrors, etc. In operation, the projection system may be subject to vibrations due to a plurality of causes. As an example, movements of parts in the lithographic apparatus may result in vibrations of a frame to which the projection system is attached, a movement of a stage such as the substrate stage or the reticle stage, or accelerations/decelerations thereof, which may result in a gas stream and/or turbulence and/or acoustic waves affecting the projection system. Such disturbances may result in vibrations of the projection system as a whole or of parts thereof. By such vibrations, displacements of lens elements or mirrors may be caused, which may in turn result in an imaging error, i.e. an error in the projection of the pattern on the substrate.

Commonly, a damping system is provided to dampen vibrations of the projection system or parts thereof. Thereto, a passive damping system may be provided as known in many forms, or a active damping system, or a combination of a passive and a active damping system. In this document, the term active damping system is to be understood as a damping system which comprises a sensor to detect an effect of a vibration (e.g. a position sensor, velocity sensor, acceleration sensor, etc) and a actuator to act on the structure to be damped or a part thereof, the actuator being driven by e.g. a controller in dependency of a signal provided by the sensor. By driving the actuator in dependency of the actuator, i.e. in response to a signal provided by the sensor, an effect of the vibration on the projection system or a part thereof, may be reduced or cancelled to a certain extent. An example of such active damping system may be provided by a feedback loop: the sensor to provide a position quantity (such as a position, speed, acceleration, jerk, etc of the projection system or a part thereof), the controller being provided with the position quantity and generating a controller output signal to drive the actuator, the actuator in turn acting on the projecting system or the part thereof so that a feedback loop is provided. The controller may be formed by any type of controller and may be implemented in the software to be executed by a microprocessor, microcontroller, or any other programmable device, or may be implemented by dedicated hardware.

A problem needing to be solved relates to the stability of the feedback loop, i.e. it is desirable to achieve a frequency behavior of the feedback loop wherein ringing and/or oscillation is prevented. At the same time, a high bandwidth of the active damping system is required, as a high bandwidth of the active damping system will allow to suppress vibrations within such high bandwidth. Due to the ever increasing demands on speed of the lithographic apparatus, movements in the lithographic apparatus tend to take place at a higher speed and consequently involving faster transients, which may result in a generation of vibrations at increasingly higher frequencies. Thus, as speed increases, it is desirable to achieve a higher bandwidth of the active damping system.

A projection system is commonly built up from a variety of parts, comprising e.g. lenses, mirrors and/or other optical elements, lens mountings and/or mirror mountings, a housing of the projection system such as a lens body, etc. As a consequence, a frequency behavior of the projection system starts, at a low frequency extreme, as a rigid body mass, thereby providing a transfer function which is inversely proportional to frequency, as illustrated in FIG. 2, where on a vertical axis a transfer function has been plotted (on a logarithmic scale), while in a horizontal axis a frequency has been plotted (on a logarithmic scale), and where RBM indicates a frequency behavior substantially corresponding to a rigid body mass. In a resonance frequency range RES, a resonance of the projection system is observed, which may be followed by a plurality of further resonance frequencies with increasing frequency, thereby overall resulting in an increase of the magnitude of the transfer function. Effectively, as from the resonance area, the projection system does not behave as a single object anymore, however instead shows a variety of resonance phenomena each corresponding to resonance of an element of the projection system. As a result thereof, the higher the frequency, the lower the remaining mass which "contributes" to the transfer function, which may be considered an explanation for the fact that the magnitude of the transfer function increases with increasing frequency, in the frequency range above the resonance frequency range. As will be understood by a skilled person, the frequency behavior of the projection system as outlined above, may result in stability problems when attempting to achieve a bandwidth of the active damping system which reaches or exceeds the resonance of the projection system. The transfer function may be expressed in terms of e.g. velocity of the projection system as a function of a force on the projection system. It is noted that the transfer function may also be expressed in any other suitable quantity, such as acceleration of the projection system as a result of force on projection system. In that case, a low frequency behavior of the transfer function will show to be frequency independent, followed by a resonance frequency range and an increase of the transfer function (showing multiple resonance peaks) above the resonance frequency range.

BRIEF SUMMARY OF THE INVENTION

It is desirable to increase a stable operating range of the active damping.

According to an embodiment of the invention, there is provided a lithographic apparatus. The lithographic apparatus includes an illumination system configured to condition a radiation beam. A support is constructed and arranged to support a patterning device, the patterning device being capable of imparting the radiation beam with a pattern in its cross-section to form a patterned radiation beam. A substrate table is constructed and arranged to hold a substrate. A projection system is configured to project the patterned radiation beam onto a target portion of the substrate. The lithographic apparatus further includes an active damping system to dampen a vibration of at least part of the projection system. The active damping system includes a combination of a sensor to measure a position quantity of the projection system and an actuator to exert a force on the projection system in dependency of a signal provided by the sensor. The active damping system is connected to a damping mass and the damping mass is connected to the projection system.

In another embodiment of the invention, there is provided a projection assembly. A projection system is configured to project the patterned radiation beam onto a target portion of the substrate. An active damping system dampens a vibration of at least part of the projection system. The active damping system includes a combination of a sensor to measure a position quantity of the projection system and an actuator to exert a force on the projection system in dependency of a signal provided by the sensor. The active damping system is connected to a damping mass. The damping mass is connected to the projection system.

According to a further embodiment of the invention, there is provided a combination of a structure and an active damping system to dampen a vibration of at least part of the structure. The active damping system includes a sensor to measure a position quantity of the structure. It also includes an actuator to exert a force on the structure in dependency of a signal provided by the sensor. The active damping system is connected to a damping mass. The damping mass is connected to the structure.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
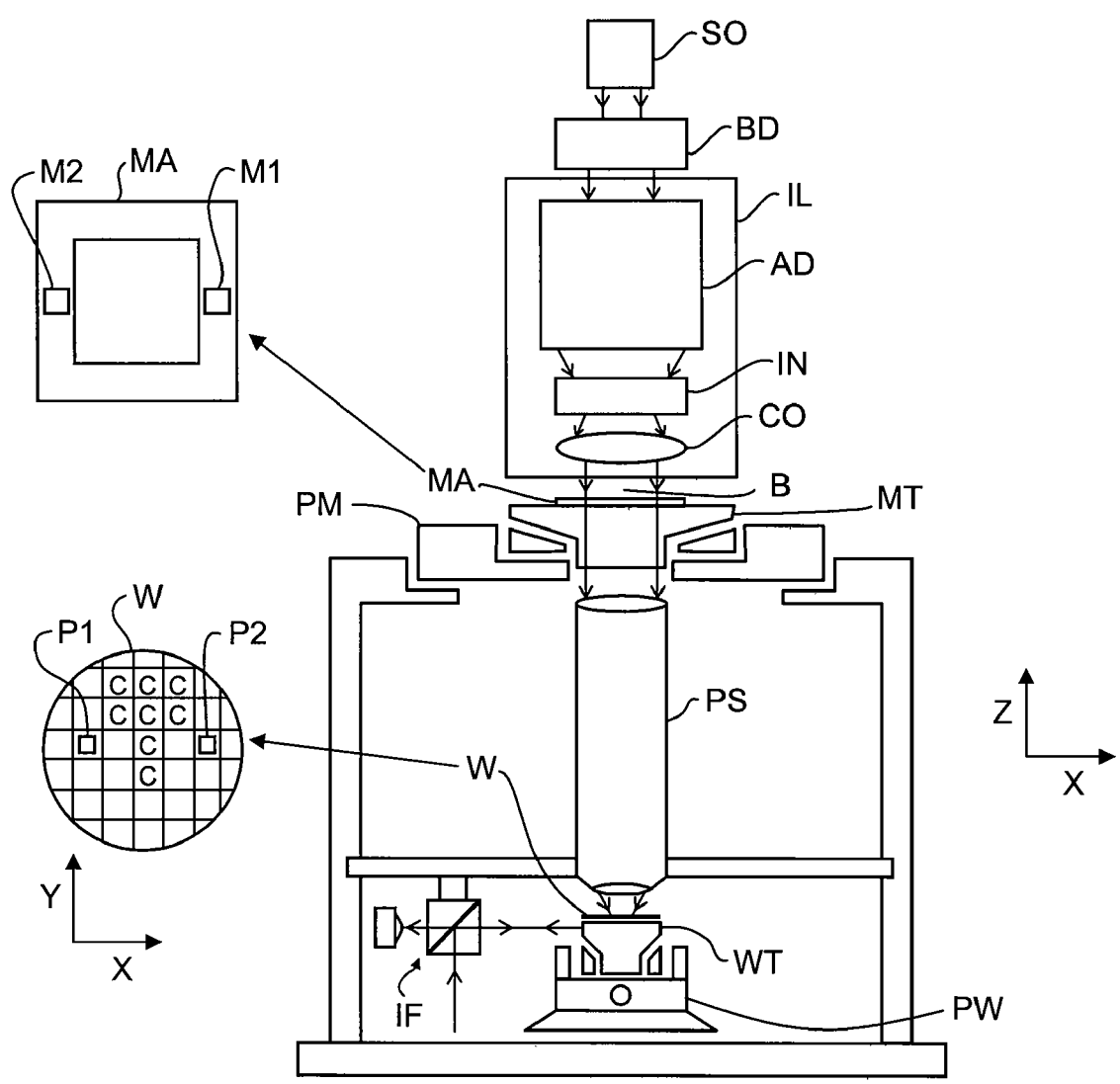
FIG. 1 depicts a lithographic apparatus in which an embodiment of the invention may be incorporated.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels.

Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as □-outer and □-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
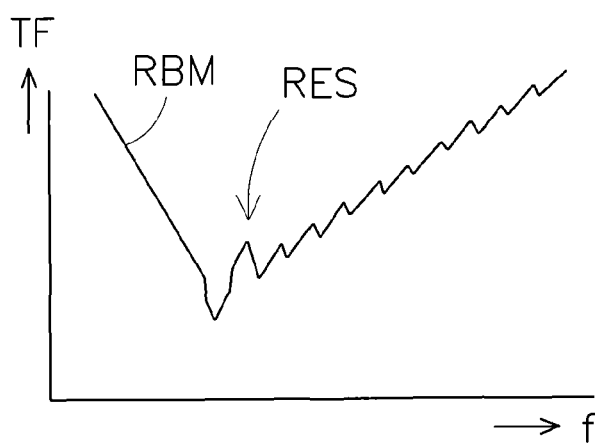
FIG. 2 depicts a frequency plot of a transfer function of a projection system of the lithographic apparatus as described with reference to FIG. 1.
Figure 3:
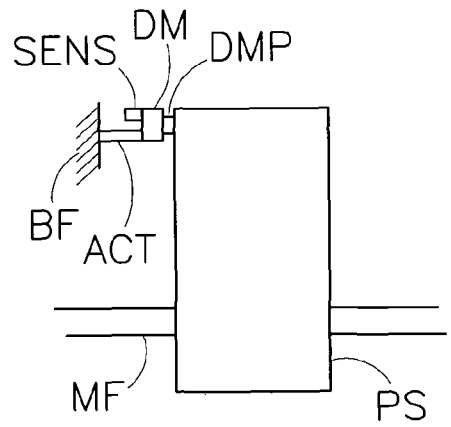
FIG. 3 depicts a highly schematic view of a projection system and an active damping system according to an embodiment of the invention.

FIG. 3 depicts a highly schematic view of a projection system PS, in this example held in a metrology frame MF. A projection system PS may be held in the metrology MF by any suitable means, e.g. comprising a rigid mounting, a resilient mounting, etc. A damping mass DM which may comprise any object, including, for example, a rigid mass, is connected to the projecting system PS by means of a damper DMP. The damping mass DM and damper DMP will be described in more detail below. For the moment, their effects may be omitted, and for the moment it may be assumed that a vibration of the projection system may coincide with a vibration of the damping mass and vice versa. A vibration of the projection system PS hence results in a vibration of the damping mass DM, which will be sensed by the sensor SENS. The same holds for a vibration of a part of the projection system (such as a lens element, mirror, or any other part thereof), which may likewise result in a vibration of the damping mass DM. Such vibration is sensed by a sensor SENS, which may comprise any type of vibration sensor, such as a position measurement sensor, a velocity measurement sensor, an acceleration measurement sensor, etc. An actuator ACT is provided which acts on the damping mass DM. In this embodiment, the actuator is connected between a base frame BF of the lithographic apparatus (however any other reaction body or other reference may be applied) and the damping mass DM. The actuator may comprise any suitable type of actuator, such as a piezo electric actuator, a motor, etc, in an embodiment use is made of a Lorentz actuator, as thereby a contactless actuator may be provided which does not provide for a mechanical contact between the base frame BF, other reaction body or reference, and the damping mass DM, as the Lorentz actuator may provide for a contactless exertion with respective parts connected to the base frame and the damping mass respectively. As explained above, the actuator may be driven (e.g. by means of suitable controller) in dependency of a signal provided by the sensor SENS, the output signal of the sensor SENS thereby providing an input signal to the controller (not shown in FIG. 3). The active damping system will (still not taking account of any effect by the damping mass DM and the damper DMP) now be faced with the frequency behavior of the transfer function of the projection system, an example of which has been described above with reference to FIG. 2.

Figure 4:
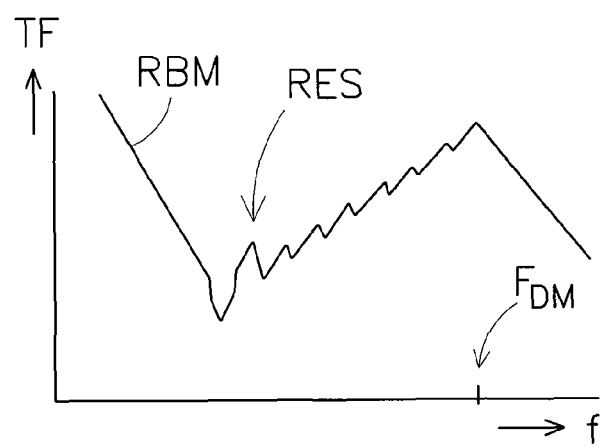
FIG. 4 depicts a frequency plot of a transfer function of a projection system of the lithographic apparatus as described with reference to FIG. 1, as observed by the active damping system according to FIG. 3.

The inventors have now devised that stability aspects of the active damping system may be favorably altered. The sensor SENS and the actuator ACT are connected to the damping mass DM, instead of being connected directly to the projection system PS. The damping mass DM in turn is connected to the projection system PS. In the above, an example of a transfer function of the projection system PS has been described with reference to FIG. 2. Making use of the damping mass DM, the transfer function of the projection system, as observed by the sensor SENS and actuator ACT respectively, will be altered. An example of an effect of the damping mass DM on such transfer function, as observed by the sensor SENS and actuator ACT, is depicted in FIG. 4. Below a frequency FDM, a behavior of the transfer function largely corresponds to that as depicted in FIG. 2, as below the frequency FDM, a vibration of the projection system PS results in a corresponding vibration in the damping mass DM, and vice versa. As of the frequency FDM the sensor SENS and actuator ACT do not or substantially not observe anymore the vibrations and resonances of the projection system PS, or parts thereof, instead the frequency behavior, as observed from the sensor SENS and the actuator ACT, is dominated by the damping mass DM. It may be useful to configure the system so that the damping mass forms a rigid body mass, at least in a frequency band of the active damping system, which may result in the sensor SENS and actuator ACT to observe a transfer function substantially corresponding to a rigid body mass, as depicted in FIG. 4 by the downwardly sloping transfer function as of the frequency FDM. Effectively, as seen from the sensor SENS and actuator ACT, as of the frequency FDM, the resonant behavior of the projection system is masked by the presence of the damping mass which is effectively interposed between the sensor and actuator on the one hand and the projection system PS on the other hand. Therefore, as of the frequency FDM, FIG. 4 shows again a transfer function which shows a downward slope with increasing frequency, thereby approaching a rigid body mass. Thus, FIG. 4 in fact shows three (3) frequency bands: a low frequency region RBM where the projection system behaves as rigid body mass, a resonant region RES showing resonances of the projection system, and a rigid body mass region substantially controlled by the damping mass DM. As a consequence, a phase of the transfer function as of the frequency FDM will show a more constant behavior, thereby possibly favoring a stable behavior of the active damping system comprising the sensor SENS and the actuator ACT. In practice, for even higher frequencies, the damping mass DM may itself again show resonances. These resonances however should be beyond an effective bandwidth of the active damping system. As the damping mass DM may have a weight and complexity lower than that of the projection system, such behavior my easily be achieved in a practical implementation. In a practical implementation, the frequency FDM may e.g. be in an order of magnitude of 1500 Hz. The damping mass DM may thereby behave as a rigid body up to 15 kHz. Due to this downwardly sloping behavior, the transfer function will achieve a low value in the frequency range between in this example 1500 and 15000 Hz, thereby possibly enabling a loop transfer function of the active damping system to drop below unity gain, which favors a stable operation of the active damping system, while achieving a high loop gain of the feedback loop of the active damping system at a lower frequency range.

In other words, high frequency resonance phenomena of the projection system or part thereof may be decoupled from the active system, the active damping system being kept stable by it being loaded by the damping mass DM.

The damping mass may be connected to the projection system PS via a resilient connection, comprising e.g. a spring, such as a damped spring. Thereby, an effective decoupling of the vibrations and resonances of parts of the projection system may be provided in the frequency range as of FDM. By designing the roll-off frequency of the resilient connection (i.e. the frequency above which a transfer of vibrations from the projection system PS to the damping mass DM decreases), lower than a bandwidth of the active damping system, i.e. in other words by providing a bandwidth of the active system which exceeds the frequency FDM in FIG. 4, advantage can be taken of the substantially resonance free behavior in that frequency band to promote a stable operation of the active damping system.

The damping mass may be connected to any relevant part of the projection system, in a practical implementation of a transmissive projection system, the damping mass may be connected to a lens mount (i.e. a mount for a plurality of lens elements thereof). In the case of a reflective projection system, the damping mass may be connected e.g. to a frame holding one or more of the mirrors. Thereby, the projection system and its constituting parts may be effectively damped, as connecting the damping mass (and therefore directly connecting the active damping system) to the lens mount or frame will have effect on a plurality of constituting parts of the projection system, e.g. lens elements, mirrors, etc, as these constituting elements are all in turn connected to the lens mount or reference frame.

A mass of the damping mass may be selected between 0.001 and 0.1 times a mass of the projection system, more particularly between 0.001 and 0.01 times the mass of the projection system, as thereby the frequency FDM in FIG. 4 can be provided in a frequency range being within a desired bandwidth of the active damping system, thereby favoring a stable closed loop operation of the active damping system.

Figure 5:
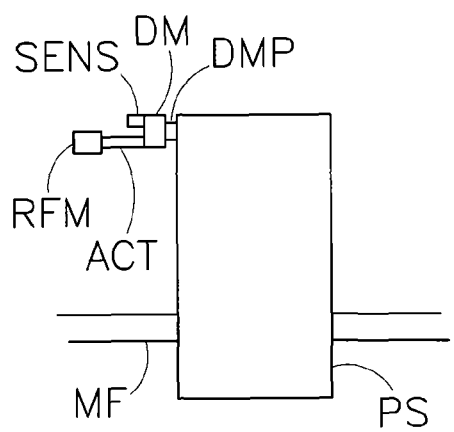
FIG. 5 depicts a projection system and an active damping system according to another embodiment in the invention.

An alternative embodiment is depicted in FIG. 5, where again a projection system PS is shown which is held by the metrology frame MF. A damping mass DM and damper DMP are provided similarly to that of FIG. 3. Also, a sensor SENS is provides which may be similar to the embodiment as described with reference to FIG. 3. Also, an actuator may be provided similar to or identical to the actuator in the embodiment described with reference to FIG. 3. Instead of however connecting the actuator ACT between a reaction body (such as a base frame BF) and the damping mass, the actuator ACT is connected between the damping mass DM and a reaction mass RFM. The reaction mass RFM may be connected to the damping mass DM via a damped spring. Above a resonance frequency of the spring, the reaction mass RFM will substantially be stationary when actuating the actuator ACT. Therefore, a need to connect the actuator ACT to stationary part such as a base frame BF, may be omitted in the FIG. 5 embodiment, thereby possibly providing an additional degree of freedom in a design of the active damping system, as a proximity of a stationary reaction body may be omitted thereby.

Although in the above, the invention has been described with reference to a projection system of a lithographic apparatus, the invention may be applied to any projection system, or even more generally to any structure which is to be mechanically damped by an active damping system. Thus, the invention as well as the embodiments described in this document may be provided as lithographic apparatus comprising a projection system and an active damping system, as a projection assembly comprising a projection system and a active system, and as a combination of a structure and an active damping system to dampen the structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The appropriately skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support configured to support a patterning device, the patterning device being capable of imparting the radiation beam with a pattern in its cross-section to form a patterned radiation beam;
    a substrate table configured to hold a substrate;
    a projection system configured to project the patterned radiation beam onto a target portion of the substrate; and
    an active damping system configured to dampen a vibration of at least part of the projection system, the active damping system comprising:
    a sensor configured to provide a signal based on a measured position quantity of a damping mass connected to the projection system; and
    an actuator connected to the damping mass and configured to exert a force on the projection system through the damping mass in response to the signal provided by the sensor.

2. The lithographic apparatus according to claim 1, wherein the damping mass is connected to the projection system via a resilient connection.

3. The lithographic apparatus according to claim 2, wherein the resilient connection comprises a spring.

4. The lithographic apparatus according to claim 2, wherein the resilient connection has a roll-off frequency lower than a bandwidth of the active damping system.

5. The lithographic apparatus according to claim 1, wherein the damping mass is connected to a lens mount or lens flange of the projection system.

6. The lithographic apparatus according to claim 1, wherein a mass of the damping mass is between 0.001 and 0.1 times a mass of the projection system.

7. The lithographic apparatus according to claim 6, wherein the mass is between 0.001 and 0.01 times the mass of the projection system.

8. A projection assembly comprising:
a projection system configured to project the patterned radiation beam onto a target portion of the substrate;
an active damping system configured to dampen a vibration of at least part of the projection system, the active damping system comprising:
a sensor configured to provide a signal based on a measured position quantity of a damping mass connected to the projection system, and
an actuator connected to the damping mass and configured to exert a force on the projection system through the damping mass in response to a signal provided by the sensor.

9. The projection assembly according to claim 8, wherein the damping mass is connected to the projection system via a resilient connection.

10. The projection assembly according to claim 9, wherein the resilient connection comprises a spring.

11. The projection assembly according to claim 10, wherein the resilient connection has a roll-off frequency lower than a bandwidth of the active damping system.

12. The projection assembly according to claim 8, wherein the damping mass is connected to a lens mount or lens flange of the projection system.

13. The projection assembly according to claim 8, wherein a mass of the damping mass is between 0.001 and 0.1 times a mass of the projection system.

14. The projection assembly of claim 13 wherein the mass is between 0.001 and 0.01 times the mass of the projection system.

15. A combination of a structure and an active damping system to dampen a vibration of at least part of the structure, wherein
the active damping system comprises a combination of
a sensor configured to provide a signal based on a measured position quantity of a damping mass connected to the structure; and
an actuator connected to the damping mass and configured to exert a force on the structure through the damping mass in response to a signal provided by the sensor.

16. The combination according to claim 15, wherein the damping mass is connected to the structure via a resilient connection.

17. The combination according to claim 16, wherein the resilient connection comprises a spring.

18. The combination according to claim 16, wherein the resilient connection has a roll-off frequency lower than a bandwidth of the active damping system.

19. The combination according to claim 15, wherein a mass of the damping mass is between 0.001 and 0.1 times a mass of the structure.

20. The combination according to claim 19, wherein the mass is between 0.001 and 0.01 times the mass of the structure.

21. A method of damping motion of a projection system of a lithographic apparatus, the apparatus including an active damping system that is connected to the projection system, the method comprising:
measuring a position quantity of a damping mass connected to at least part of the projection system; and
operating an actuator of the active damping system to exert a force on the projection system through the damping mass of the lithographic apparatus in accordance with the measured position quantity, wherein the actuator is connected to the damping mass.

22. The lithographic apparatus according to claim 3, wherein the spring is a damped spring.

23. The projection assembly according to claim 9, wherein the spring is a damped spring.

24. The combination according to claim 16, wherein the spring is a damped spring.

* * * * *